US011595039B2

(12) United States Patent
Gallo et al.

(10) Patent No.: US 11,595,039 B2
(45) Date of Patent: Feb. 28, 2023

(54) POWER SWITCHING CIRCUIT AND CORRESPONDING METHOD OF OPERATION

(71) Applicant: STMicroelectronics S.r.l., Agrate Brianza (IT)

(72) Inventors: Noemi Gallo, Milan (IT); Edoardo Botti, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/658,016

(22) Filed: Apr. 5, 2022

(65) Prior Publication Data
US 2022/0337236 A1 Oct. 20, 2022

(30) Foreign Application Priority Data
Apr. 19, 2021 (IT) .................. 102021000009773

(51) Int. Cl.
| *H03K 17/00* | (2006.01) |
| *H03K 17/56* | (2006.01) |
| *H03K 19/20* | (2006.01) |
| *H03K 17/687* | (2006.01) |

(52) U.S. Cl.
CPC ........... *H03K 17/56* (2013.01); *H03K 17/687* (2013.01); *H03K 19/20* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| 6,288,605 | B1 | 9/2001 | Botti et al. |
| 7,332,943 | B2* | 2/2008 | Botti .................. H03F 3/2171 |
| | | | 327/112 |
| 2007/0177322 | A1 | 8/2007 | Jacobs |
| 2013/0049813 | A1 | 2/2013 | Sato et al. |
| 2014/0347102 | A1* | 11/2014 | Teplechuk ........... H03K 5/1252 |
| | | | 327/109 |
| 2020/0099285 | A1* | 3/2020 | Sugawara ........ H03K 17/08122 |
| 2022/0103061 | A1* | 3/2022 | Aoki .................... H03K 17/165 |
| 2022/0239224 | A1* | 7/2022 | Liao ....................... H02M 1/08 |

OTHER PUBLICATIONS

Berkhout, Marco "Integrated Overcurrent Protection System for Class-D Audio Power Amplifiers", IEEE Journal of Solid-State Circuits, vol. 40, No. 11, Nov. 2005, pp. 2237-2245.

* cited by examiner

*Primary Examiner* — Tuan T Lam
(74) *Attorney, Agent, or Firm* — Slater Matsil, LLP

(57) ABSTRACT

A circuit includes a high-side switch and a low-side switch. A first inverter includes first and second discharge current paths activatable to sink first and second discharge currents, respectively, from the control terminal of the high-side switch. A second inverter includes first and second charge current paths activatable to source first and second charge currents to the control terminal of the low-side switch. A high-side sensing current path includes an intermediate high-side control node, and a low-side sensing current path includes an intermediate low-side control node. The second discharge current path is selectively enablable in response to a high-side detection signal at the intermediate high-side control node having a high logic value, and the second charge current path is selectively enablable in response to a low-side detection signal at the intermediate low-side control node having a low logic value.

20 Claims, 3 Drawing Sheets

POWER SWITCHING CIRCUIT AND CORRESPONDING METHOD OF OPERATION

CROSS-REFERENCE TO RELATED APPLICATIONS

This application claims the benefit of Italian Patent Application No. 102021000009773, filed on Apr. 19, 2021, which application is hereby incorporated herein by reference.

TECHNICAL FIELD

The description relates to power switching circuits.

One or more embodiments may apply to amplifiers operating in Pulse Width Modulation (PWM) mode, such as half-bridge power switching stages for use in class-D amplifiers.

BACKGROUND

Monitoring and controlling the region of operation of the power transistors (e.g., power metal-oxide-semiconductor, MOS, transistors) which drive an output load is a desirable feature for switching amplifiers that include half-bridge arrangements (such as, for instance, class-D switching amplifiers).

Generally, logic circuits and analog circuits may be used to counter cross-conduction between two power transistors in the same half-bridge circuit. An example of a circuit configured to counter cross-conduction in a half-bridge power device is known from document U.S. Pat. No. 6,288,605 B1 assigned to the same Applicant of the instant application. As disclosed by document U.S. Pat. No. 6,288,605 B1, an output power switching stage, including a power switching device for the supply line and a complementary power switching device for the ground rail driven in phase opposition by a pulse width modulated (PWM) drive signal, is provided with sensors detecting a substantial turn-off state of each of the two power switching devices and generating a pair of logic signals. A combinatory logic circuit combines the drive signal of the half-bridge and the pair of logic signals and generates a pair of driving signals having opposite phase for the respective power switching devices. The switching to a turn-on state of any of the two power devices is enabled upon verifying a substantially attained turn-off state by the device complementary to the device commanded to turn-on. In particular, each one of the pair of complementary power switching devices constituting the high side driver and the low side driver stages, respectively, is provided with a circuit capable of monitoring the turn-on or the turn-off state, producing a respective logic signal, sens-H and sens-L, and indicating the state of the switching device. The pair of logic signals is combined with a digital driving input signal INPUT by a combinatory logic circuit, realized in the example by an AND gate switching the low side driver device to ground potential and an OR gate switching the high side driver device to the supply line. This ensures the switching from a cut-off state to a conduction state of one or the other power switching device only if it is enabled to do so by a positive verification of the substantially attained turn-off state of the switching device complementary to the switching device commanded to turn-on.

According to an example disclosed by document U.S. Pat. No. 6,288,605 B1, the state (on or off) of the power devices constituting the output stage of the half-bridge can be detected by means of respective detection circuits. Each power device has an associated transistor of the same kind, but having fractional dimensions, e.g., 1/100th of the dimensions of the respective power device. Each detecting transistor has an associated bias load current generator (Iref-H and Iref-L). The output node of the detection stage so constituted is coupled to the input of a logic inverter. The detection transistor is driven in parallel with the respective power transistor (e.g., by the same drive signal), and when the current flowing in the detection transistor exceeds the current established by the respective bias current generator, the respective inverter switches to generate the output logic signal (respectively sens-H and sens-L). Establishing a certain current level, definable by dimensioning the respective current generator, suitable to consider as practically off the respective power switching device, a pair of logic signals (sens-H and sens-L) is obtained, which reliably confirm a substantially attained cut-off phase of one or the other of the two power switching devices of the switching output stage. The two logic signals, sens-H and sens-L, combined to the driving digital signal INPUT, ensure the absence of overlapping of turn-on states of the two power devices of the stage.

Additionally, circuits that regulate or control (e.g., instantaneously) the speed at which a power transistor in forward conduction turns on may be used to avoid excessive current variations per unit of time (di/dt) which could cause operation issues and reliability issues of the half-bridge arrangement. In fact, an excessive slope of the current flowing through the power transistors of the half-bridge may generate excessive voltage overshoot due to the parasitic inductances in the circuit (e.g., inductances due to the bonding of the integrated circuits within a package). In a half-bridge arrangement comprising a power transistor in forward conduction and a complementary (e.g., opposite) power transistor in reverse conduction which drive an external load, a commutation where the power transistor opposite to the transistor in reverse conduction turns on may be critical, insofar as the power transistor which turns on discharges the intrinsic recirculation diode of the power transistor in reverse conduction.

Therefore, there is a need in the art to provide power switching circuits including an improved control of the turn-on phase of the power transistors included therein.

SUMMARY

An object of one or more embodiments is to contribute in providing such improved power switching circuits.

According to one or more embodiments, such an object can be achieved by a circuit (e.g., a power switching circuit) having the features set forth in the claims that follow.

One or more embodiments may relate to a corresponding method of operating a power switching circuit.

The claims are an integral part of the technical teaching provided herein in respect of the embodiments.

In one or more embodiments, a circuit may comprise a high-side switch coupled between a supply voltage rail and an output node, and a low-side switch coupled between the output node and a reference voltage rail. The circuit may comprise a first inverter arrangement configured to receive a high-side control signal and to produce a high-side gate control signal for the high-side switch, and a second inverter arrangement configured to receive a low-side control signal and to produce a low-side gate control signal for the low-side switch. The first inverter arrangement may comprise a first discharge current path between the control terminal of the high-side switch and a respective reference voltage rail, the first discharge current path being activatable to sink a first discharge current from the control terminal of the high-side switch, and a second discharge current path between the control terminal of the high-side switch and the respective reference voltage rail, the second discharge current path being activatable to sink a second discharge current from the control terminal of the high-side switch. The second inverter arrangement may comprise a first charge current path between the control terminal of the low-side switch and a respective supply voltage rail, the first charge current path being activatable to source a first charge current to the control terminal of the low-side switch, and a second charge current path between the control terminal of the low-side switch and the respective supply voltage rail, the second charge current path being activatable to source a second charge current to the control terminal of the low-side switch.

The circuit may comprise a high-side sensing current path arranged between the supply voltage rail and the respective reference voltage rail. The high-side sensing current path may comprise a high-side sensing transistor having a current path coupled between the supply voltage rail and an intermediate high-side control node, and a gate terminal coupled to the control terminal of the high-side switch, and a first high-side current source coupled between the intermediate high-side control node and the respective reference voltage rail to sink a first high-side reference current from the intermediate high-side control node.

The circuit may comprise a low-side sensing current path arranged between the reference voltage rail and the respective supply voltage rail. The low-side sensing current path may comprise a low-side sensing transistor having a current path coupled between the reference voltage rail and an intermediate low-side control node, and a gate terminal coupled to the control terminal of the low-side switch, and a first low-side current source coupled between the intermediate low-side control node and the respective supply voltage rail to source a first low-side reference current to the intermediate low-side control node.

The second discharge current path may be selectively enabled in response to a high-side detection signal at the intermediate high-side control node having a high logic value, and the second charge current path may be selectively enabled in response to a low-side detection signal at the intermediate low-side control node having a low logic value.

One or more embodiments may thus facilitate controlling the turn-on phase of power transistors included in a half-bridge arrangement of a power switching circuit.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for brevity.

One or more embodiments may relate to a power switching circuit including an improved control of the turn-on phase of the power transistors. By way of introduction to the detailed description of exemplary embodiments, reference may first be made to FIG. 1, which is a circuit diagram exemplary of a power switching circuit 10 and related control circuitry.

The switching circuit 10 comprises an output half-bridge arrangement including a high-side switch HS (e.g., a p-channel MOS power transistor) coupled between a supply voltage rail 102 configured to provide a supply voltage VCC (e.g., in the range of 12 V to 18 V) and an output node 104, and a low-side switch LS (e.g., an n-channel MOS power transistor) coupled between the output node 104 and a reference voltage rail 106 configured to provide a reference voltage GND (e.g., 0 V). Complementary commutations of the high-side switch HS and the low-side switch LS result in a PWM output signal OUTPUT being produced at the output node 104.

Figure 1:
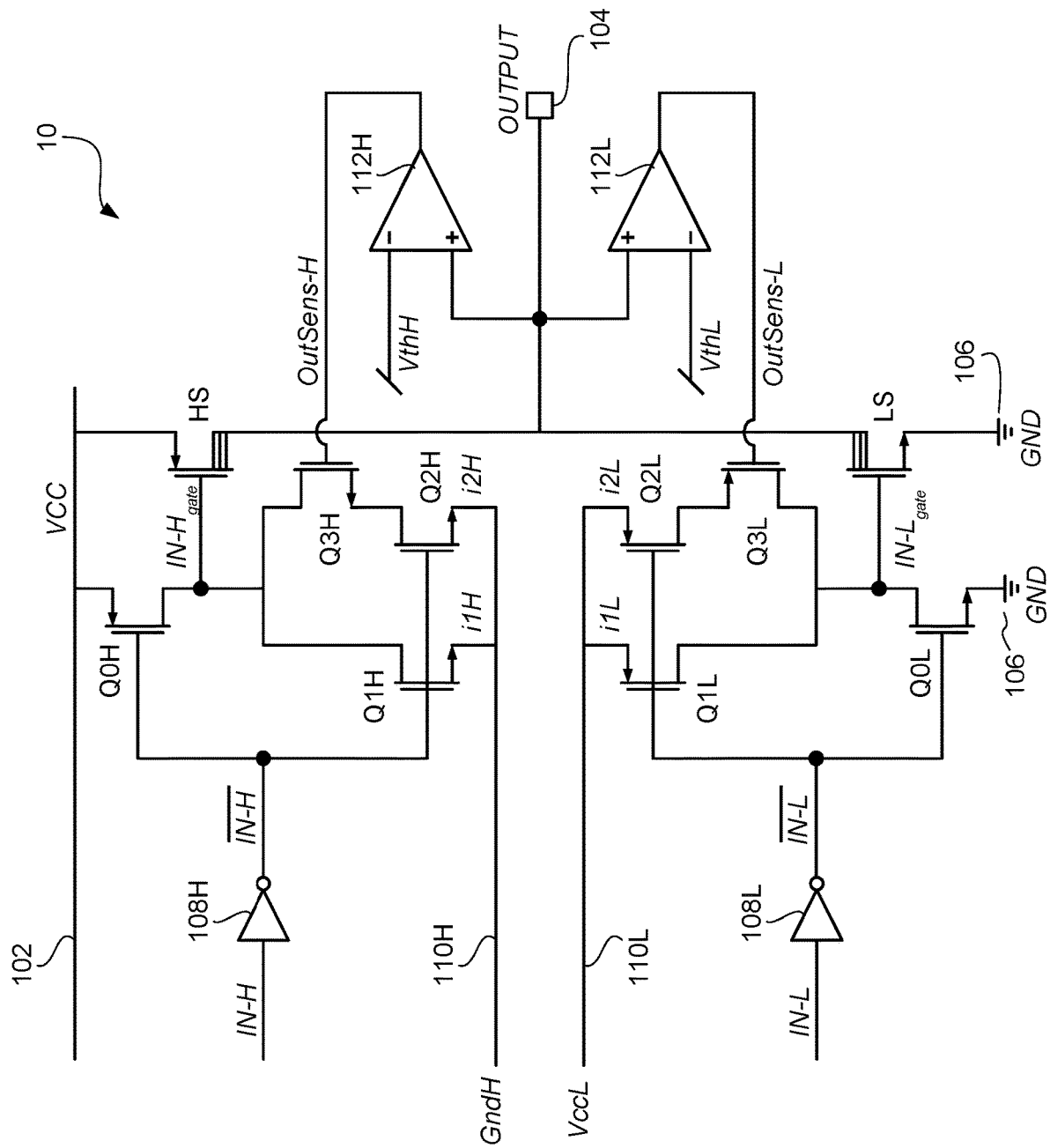
FIG. 1 is a circuit diagram exemplary of a power switching circuit comprising an output half-bridge arrangement and related control circuitry.

As exemplified in FIG. 1, the switching circuit 10 is configured to receive a high-side input control signal IN-H and a low-side input control signal IN-L for controlling commutation of the high-side and low-side switches, respectively. The high-side and low-side input control signals IN-H, IN-L may not be directly applied to the control terminals of the high-side and low-side switches HS, LS, but may be used to control respective "soft turn-on" circuits which produce the (gate) control signals $IN\text{-}H_{gate}$, $IN\text{-}L_{gate}$ applied to the control terminals of the high-side and low-side switches HS, LS, respectively.

As exemplified in FIG. 1, the high-side soft turn-on circuit may comprise a first inverter circuit 108H configured to receive the high-side input control signal IN-H and produce an inverted high-side input control signal $\overline{IN\text{-}H}$, and a second inverter circuit configured to receive the inverted high-side input control signal $\overline{IN\text{-}H}$ and produce the high-side (gate) control signal $IN\text{-}H_{gate}$ having substantially the same polarity as the high-side input control signal IN-H. In particular, the second inverter circuit may include a single "upper" branch and a pair of "lower" branches, e.g., it may comprise:

- a transistor Q0H (e.g., a p-channel MOS transistor) having a current path coupled between the supply voltage rail 102 and the control terminal of the high-side switch HS, and a (gate) control terminal configured to receive the inverted high-side input control signal $\overline{\text{IN-H}}$ from inverter 108H;
- a transistor Q1H (e.g., an n-channel MOS transistor) having a current path coupled between the control terminal of the high-side switch HS and a respective reference voltage rail 110H configured to provide a reference voltage GndH (possibly the same as the reference voltage rail 106), and a (gate) control terminal configured to receive the inverted high-side input control signal $\overline{\text{IN-H}}$ from inverter 108H;
- a transistor Q2H (e.g., an n-channel MOS transistor) having a current path coupled between the control terminal of the high-side switch HS and the reference voltage rail 110H, and a (gate) control terminal configured to receive the inverted high-side input control signal $\overline{\text{IN-H}}$ from inverter 108H; and
- a control transistor Q3H (e.g., an n-channel MOS transistor) having a current path coupled in series to the transistor Q2H and a (gate) control terminal configured to receive a high-side turn-on control signal OutSens-H.

As exemplified in FIG. 1, the high-side turn-on control signal OutSens-H may be produced by a high-side high voltage comparator circuit 112H configured to compare the output signal OUTPUT to a threshold voltage VthH (e.g., a threshold value between GND and VCC). For instance, the high-side comparator circuit 112H may receive the output signal OUTPUT at a respective non-inverting input, and the threshold voltage VthH at a respective inverting input.

Similarly, the low-side soft turn-on circuit may comprise a first inverter circuit 108L configured to receive the low-side input control signal IN-L and produce an inverted low-side input control signal $\overline{\text{IN-L}}$, and a second inverter circuit configured to receive the inverted low-side input control signal $\overline{\text{IN-L}}$ and produce the low-side (gate) control signal IN-L$_{gate}$ having substantially the same polarity as the low-side input control signal IN-L. In particular, the second inverter circuit may include a single "lower" branch and a pair of "upper" branches, e.g., it may comprise:

- a transistor Q0L (e.g., an n-channel MOS transistor) having a current path coupled between the reference voltage rail 106 and the control terminal of the low-side switch LS, and a (gate) control terminal configured to receive the inverted low-side input control signal $\overline{\text{IN-L}}$ from inverter 108L;
- a transistor Q1L (e.g., a p-channel MOS transistor) having a current path coupled between the control terminal of the low-side switch LS and a respective supply voltage rail 110L configured to provide a supply voltage VccL (possibly the same as the supply voltage rail 102), and a (gate) control terminal configured to receive the inverted low-side input control signal $\overline{\text{IN-L}}$ from inverter 108L;
- a transistor Q2L (e.g., a p-channel MOS transistor) having a current path coupled between the control terminal of the low-side switch LS and the supply voltage rail 110L, and a (gate) control terminal configured to receive the inverted low-side input control signal IN-L from inverter 108L; and
- a control transistor Q3L (e.g., a p-channel MOS transistor) having a current path coupled in series to the transistor Q2L and a (gate) control terminal configured to receive a low-side turn-on control signal OutSens-L.

As exemplified in FIG. 1, the low-side turn-on control signal OutSens-L may be produced by a low-side high voltage comparator circuit 112L configured to compare the output signal OUTPUT to a threshold voltage VthL (e.g., a threshold value between GND and VCC). For instance, the low-side comparator circuit 112L may receive the output signal OUTPUT at a respective non-inverting input, and the threshold voltage VthL at a respective inverting input.

Therefore, the switching circuit 10 exemplified in FIG. 1 facilitates controlling the current flowing into the high-side switch HS and the low-side switch LS during the respective turn-on phases. The control circuits exemplified in FIG. 1 allow turning on the power transistors HS, LS in forward conduction by means of intermediate control stages that control the charge current of the gate terminals of the power transistors HS, LS so as to control the slope of the respective (drain) current.

For instance, with reference to the high-side control circuit and with reference to a driving case where the high-side transistor HS is in direct conduction and the low-side transistor LS is in reverse conduction, transistors Q1H and Q2H operate as current generators to generate corresponding currents i1H and i2H for switching on the power transistor HS (e.g., discharging the gate terminal of transistor HS by sinking currents i1H and i2H from the gate terminal of power transistor HS). Transistors Q1H and Q2H are activated as a function of the high-side input control signal IN-H (insofar as $\overline{\text{IN-H}}$ is substantially an inverted replica of IN-H). When the high-side power transistor HS turns on in forward conduction (IN-H switching from '1' to '0'), the output signal OUTPUT is held to the ground level GND by the low-side power transistor LS which is in reverse conduction through the respective recirculation diode. Thus, the high-side turn-on control signal OutSens-H is at a low logic level, which results in the control transistor Q3H being turned off. In this condition, only the transistor Q1H can sink a current i1H from the (gate) control terminal of the high-side power transistor HS, which results in the high-side power transistor HS turning on slowly and discharging just as slowly the recirculation diode of the low-side power transistor LS (which could otherwise generate high current spikes if discharged too fast). After the recirculation diode of the low-side power transistor LS has been (slowly) discharged, the output signal OUTPUT exceeds the threshold voltage VthH and the high-side turn-on control signal OutSens-H switches to a high logic level, switching the control transistor Q3H to a conductive state. In turn, both the transistors Q1H and Q2H can sink currents (i1H and i2H, respectively) from the (gate) control terminal of the high-side power transistor HS, which results in the high-side power transistor HS turning on more rapidly. Optionally, the current i1H may be lower than the current i2H.

Similarly, with reference to the low-side control circuit and with reference to a driving case where the low-side transistor LS is in direct conduction and the high-side transistor HS is in reverse conduction, transistors Q1L and Q2L operate as current generators to generate corresponding currents i1L and i2L for switching on the power transistor LS (e.g., charging the gate terminal of transistor LS by sourcing currents i1L and i2L to the gate terminal of power transistor LS). Transistors Q1L and Q2L are activated as a function of the low-side input control signal IN-L (insofar as $\overline{\text{IN-L}}$ is substantially an inverted replica of IN-L). When the low-side power transistor LS turns on in forward conduction (IN-L switching from '0' to '1'), the output signal OUTPUT is held to the supply level VCC by the high-side power transistor HS which is in reverse conduction through the respective recirculation diode. Thus, the low-side turn-on control signal OutSens-L is at a high logic level, which results in the control transistor Q3L being turned off. In this condition, only the transistor Q1L can source a current i1L to the (gate) control terminal of the low-side power transistor LS, which results in the low-side power transistor LS turning on slowly and discharging just as slowly the recirculation diode of the high-side power transistor HS (which could otherwise generate high current spikes if discharged too fast). After the recirculation diode of the high-side power transistor HS has been (slowly) discharged, the output signal OUTPUT falls below the threshold voltage VthL and the low-side turn-on control signal OutSens-L switches to a low logic level, switching the control transistor Q3L to a conductive state. In turn, both the transistors Q1L and Q2L can source currents (i1L and i2L, respectively) to the (gate) control terminal of the low-side power transistor LS, which results in the low-side power transistor LS turning on more rapidly. Optionally, the current i1L may be lower than the current i2L.

Therefore, a switching circuit 10 as exemplified in FIG. 1 facilitates controlling the current which flows into the power transistors HS, LS during the respective turn-on phases, at the cost of implementing a pair of high voltage comparators 112H, 112L. Such comparators, however, may turn out to occupy a large silicon area and/or to drain a relevant amount of power, so that alternative solutions may be desirable.

Figure 2:
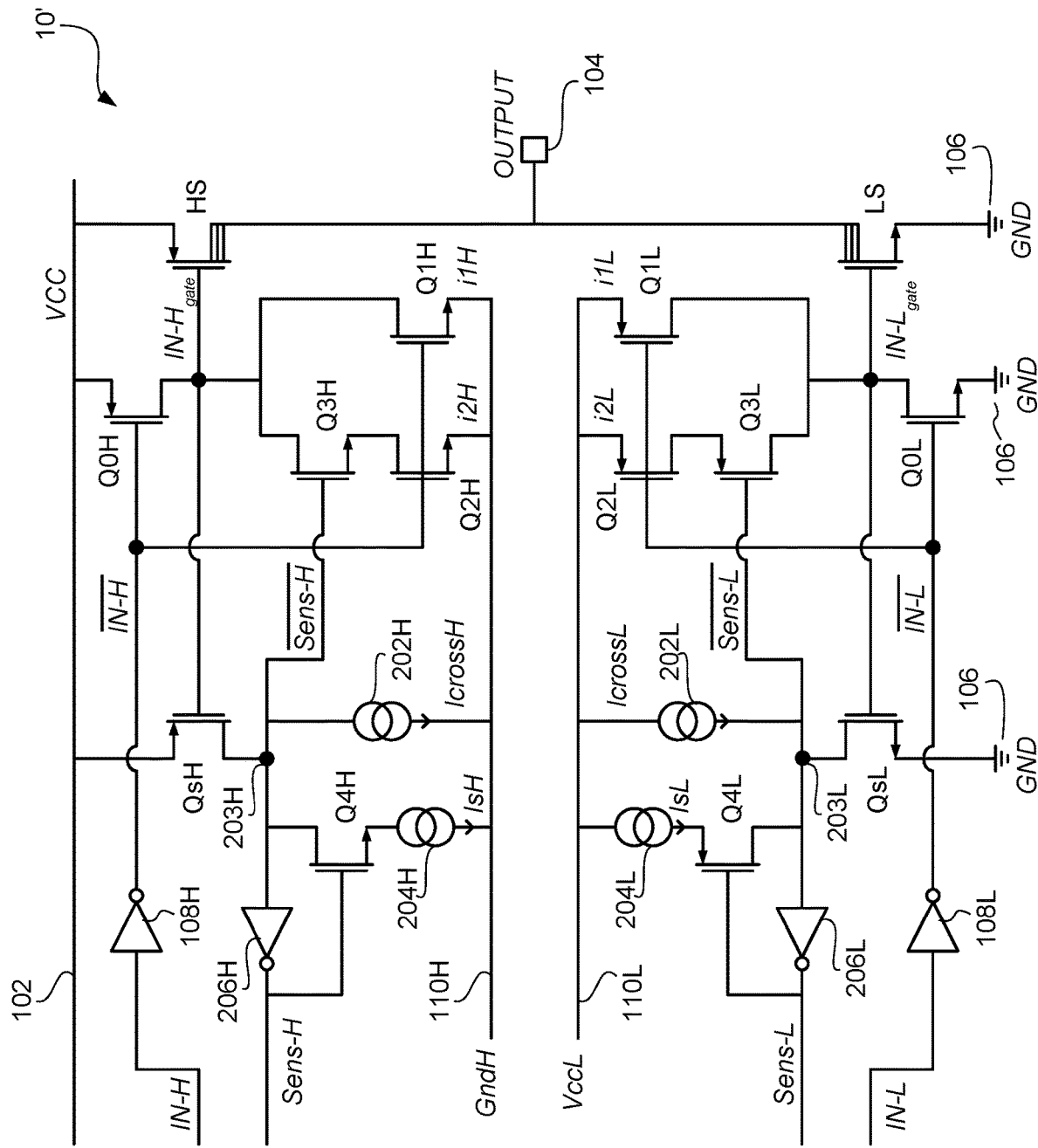
FIG. 2 is a circuit diagram exemplary of a power switching circuit comprising an output half-bridge arrangement and related control circuitry according to one or more embodiments of the present description.

For instance, FIG. 2 is a circuit diagram exemplary of a switching circuit 10' according to one or more embodiments, where the control transistors Q3H and Q3L are configured to receive respective turn-on control signals $\overline{\text{Sens-H}}$ and $\overline{\text{Sens-L}}$ generated without resorting to the use of voltage comparators.

In particular, the switching circuit 10' may comprise the same elements HS, 108H, Q0H, Q1H, Q2H, Q3H, LS, 108L, Q0L, Q1L, Q2L, Q3L described with reference to FIG. 1 and operating in a similar way. A corresponding description will not be repeated herein for the sake of brevity only.

Additionally, the switching circuit 10' may comprise a high-side sensing circuit comprising a current flow line arranged between the supply voltage rail 102 and the reference voltage rail 110H, the current flow line comprising:
  a detection transistor QsH (e.g., a p-channel MOS transistor) having a current path coupled between the supply voltage rail 102 and an intermediate node 203H, and a (gate) control terminal coupled to the (gate) control terminal of the high-side power transistor HS to receive the same high-side (gate) control signal IN-$H_{gate}$, and
  a first current generator 202H coupled between the intermediate node 203H and the reference voltage rail 110H to sink a current IcrossH from the intermediate node 203H.

As exemplified in FIG. 2, the intermediate node 203H may be coupled to the (gate) control terminal of the control transistor Q3H. The high-side turn-on control signal $\overline{\text{Sens-H}}$ may be generated at the node 203H intermediate the detection transistor QsH and the first current generator 202H.

The detection transistor QsH may be, for instance, of the same kind of the high-side power transistor HS but may have fractional dimensions, e.g., between 1/100th and 1/10000th of the dimensions of the high-side power transistor HS.

Optionally, the high-side sensing circuit may further comprise:
  a second current generator 204H coupled between the node 203H and the reference voltage rail 110H to sink a current IsH from the node 203H,
  an inverter circuit 206H coupled to the node 203H to generate an inverted high-side turn-on control signal Sens-H, and
  a current-regulating transistor Q4H (e.g., an n-channel MOS transistor) having a current path coupled in series to the second current generator 204H and a (gate) control terminal coupled to the output of the inverter circuit 206H to receive the inverted high-side turn-on control signal Sens-H.

Additionally, the switching circuit 10' may comprise a low-side sensing circuit comprising a current flow line arranged between the reference voltage rail 106 and the supply voltage rail 110L, the current flow line comprising:
  a detection transistor QsL (e.g., an n-channel MOS transistor) having a current path coupled between the reference voltage rail 106 and an intermediate node 203L, and a (gate) control terminal coupled to the (gate) control terminal of the low-side power transistor LS to receive the same low-side (gate) control signal IN-$L_{gate}$, and
  a first current generator 202L coupled between the intermediate node 203L and the supply voltage rail 110L to source a current IcrossL to the intermediate node 203L.

As exemplified in FIG. 2, the intermediate node 203L may be coupled to the (gate) control terminal of the control transistor Q3L. The low-side turn-on control signal $\overline{\text{Sens-L}}$ may be generated at the node 203L intermediate the detection transistor QsL and the first current generator 202L.

The detection transistor QsL may be, for instance, of the same kind of the low-side power transistor LS but may have fractional dimensions, e.g., between 1/100th and 1/10000th of the dimensions of the low-side power transistor LS.

Optionally, the low-side sensing circuit may further comprise:
  a second current generator 204L coupled between the node 203L and the supply voltage rail 110L to source a current IsL to the node 203L,
  an inverter circuit 206L coupled to the node 203L to generate an inverted low-side turn-on control signal Sens-L, and
  a current-regulating transistor Q4L (e.g., a p-channel MOS transistor) having a current path coupled in series to the second current generator 204L and a (gate) control terminal coupled to the output of the inverter circuit 206L to receive the inverted low-side turn-on control signal Sens-L.

Operation of the high-side sensing and control circuitry as exemplified in FIG. 2 is discussed below. When the low-side power transistor LS is on (IN-L='1', IN-$L_{gate}$='1'), the detection transistor QsL is also on, resulting in the low-side turn-on control signal $\overline{\text{Sens-L}}$ having a low logic value ($\overline{\text{Sens-L}}$='0') and thus the inverted low-side turn-on control signal Sens-L having a high logic value (Sens-L='1'). In the high-side portion, the high-side input control signal IN-H having a high logic value (IN-H='1') causes the high-side power transistor HS and the detection transistor QsH to be off, resulting in the high-side turn-on control signal $\overline{\text{Sens-H}}$ having a low logic value ($\overline{\text{Sens-H}}$='0') and thus the inverted high-side turn-on control signal Sens-H having a high logic value (Sens-H='1'). Due to the high-side turn-on control signal Sens-H having a high logic value, the second current generator 204H is enabled to sink a current IsH from node 203H and a total current IsoftH=IsH+IcrossH is sunk from node 203H, which results in a higher gate-source voltage threshold (e.g., referred to as Vgs.softH) of the power transistor HS to be exceeded before the high-side power transistor HS is detected as "on" (i.e., before $\overline{\text{Sens-H}}$ switches to a high logic value and Sens-H switches to a low logic value). When the switching stage commutes (e.g., when IN-H switches to a low logic value), the high-side power transistor HS starts to turn on, increasing its gate-source voltage Vgs by means of the current i1H sunk by transistor Q1H. As a result of the gate terminal of the high-side power transistor HS (slowly) discharging, the detection transistor QsH starts to turn on. When the current flowing through the detection transistor QsH exceeds the current IsoftH=IsH+IcrossH sunk from node 203H by the current generators 202H and 204H, $\overline{\text{Sens-H}}$ switches to a high logic value and Sens-H switches to a low logic value. Thus, the current-regulating transistor Q4H switches off and disables the current generator 204H. Since in this condition only a current IcrossH is sunk from node 203H, the gate-source voltage threshold of the power transistor HS to be exceeded before the high-side power transistor HS is detected as "on" decreases to a lower value (e.g., referred to as Vgs.crossH), providing hysteresis. At the same time, Sens-H='0' and $\overline{\text{Sens-H}}$='1' also results in the control transistor Q3H becoming conductive, facilitating a controlled switch-on phase of the high-side power transistor HS and a faster discharge of the high-side power transistor gate terminal after the high-side power transistor has been "softly" turned on.

Operation of the low-side sensing and control circuitry as exemplified in FIG. 2 is discussed below. When the high-side power transistor HS is on (IN-H='0', IN-H$_{gate}$='0'), the detection transistor QsH is also on, resulting in the high-side turn-on control signal $\overline{\text{Sens-H}}$ having a high logic value ($\overline{\text{Sens-H}}$='1') and thus the inverted high-side turn-on control signal Sens-H having a low logic value (Sens-H='0'). In the low-side portion, the low-side input control signal IN-L having a low logic value (IN-L='0') causes the low-side power transistor LS and the detection transistor QsL to be off, resulting in the low-side turn-on control signal $\overline{\text{Sens-L}}$ having a high logic value ($\overline{\text{Sens-L}}$='1') and thus the inverted low-side turn-on control signal Sens-L having a low logic value (Sens-L='0'). Due to the low-side turn-on control signal Sens-L having a low logic value, the second current generator 204L is enabled to source a current IsL to node 203L and a total current IsoftL=IsL+IcrossL is sourced to node 203L, which results in a higher gate-source voltage threshold (e.g., referred to as Vgs.softL) of the power transistor LS to be exceeded before the low-side power transistor LS is detected as "on" (i.e., before $\overline{\text{Sens-L}}$ switches to a low logic value and Sens-L switches to a high logic value). When the switching stage commutes (e.g., when IN-L switches to a high logic value), the low-side power transistor LS starts to turn on, increasing its gate-source voltage Vgs by means of the current UL sourced by transistor Q1L. As a result of the gate terminal of the low-side power transistor LS (slowly) charging, the detection transistor QsL starts to turn on. When the current flowing through the detection transistor QsL exceeds the current IsoftL=IsL+IcrossL sourced to node 203L by the current generators 202L and 204L, $\overline{\text{Sens-L}}$ switches to a low logic value and Sens-L switches to a high logic value. Thus, the current-regulating transistor Q4L switches off and disables the current generator 204L. Since in this condition only a current IcrossL is sourced to node 203L, the gate-source voltage threshold of the power transistor LS to be exceeded before the low-side power transistor LS is detected as "on" decreases to a lower value (e.g., referred to as Vgs.crossL), providing hysteresis. At the same time, Sens-L='1' and $\overline{\text{Sens-L}}$='0' also results in the control transistor Q3L becoming conductive, facilitating a controlled switch-on phase of the low-side power transistor LS and a faster charge of the low-side power transistor gate terminal after the low-side power transistor has been "softly" turned on.

Figure 3:
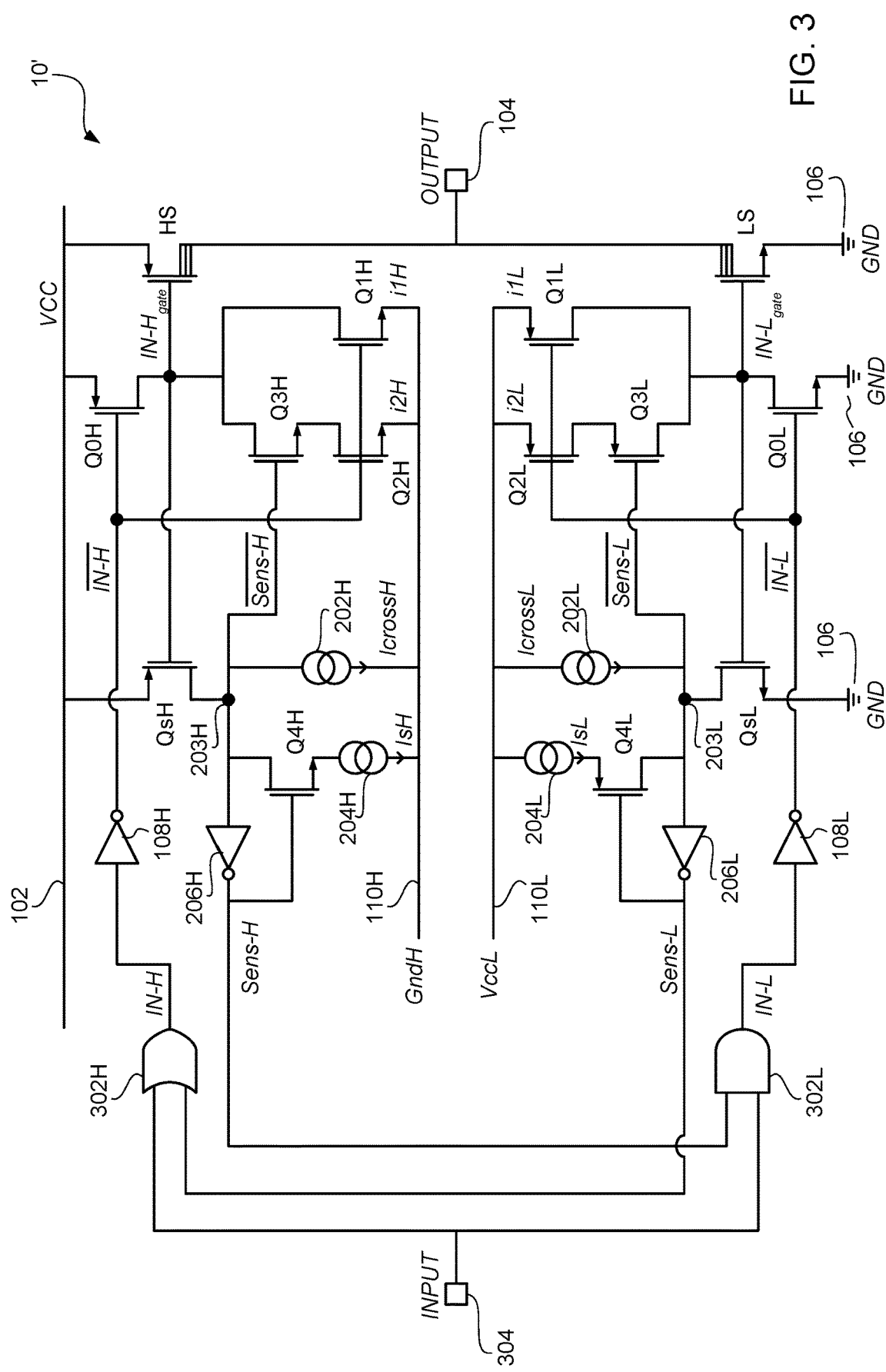
FIG. 3 is a further circuit diagram exemplary of a power switching circuit comprising an output half-bridge arrangement and related control circuitry according to one or more embodiments of the present description.

In one or more embodiments as exemplified in FIG. 3, the switching circuit 10' may further comprise circuitry configured to counter cross-conduction between the high-side and the low-side power transistors HS, LS.

For instance, as exemplified in FIG. 3, the switching circuit 10' may comprise an input node 304 configured to receive a driving digital signal INPUT (e.g., a PWM signal), an OR logic gate 302H configured to apply OR processing to the driving digital signal INPUT and to the inverted low-side turn-on control signal Sens-L to produce the high-side input control signal IN-H to be fed to the inverter 108H, and an AND logic gate 302L configured to apply AND processing to the driving digital signal INPUT and to the inverted high-side turn-on control signal Sens-H to produce the low-side input control signal IN-L to be fed to the inverter 108L.

In the circuit exemplified in FIG. 3, when the low-side power transistor LS is on (e.g., INPUT='1'), the anti-cross conduction circuit provides IN-L='1' and Sens-L='1'. The same circuit provides that the high-side power transistor is off, bringing IN-H='1' and consequently Sens-H='1'. When the driving digital signal INPUT switches to a low logic value (e.g., INPUT='0'), the high-side power transistor HS remains off, since Sens-L maintains a high logic value. On the low-side, the low-side input control signal IN-L having a low logic value leads to the progressive discharge of the gate of the low-side power transistor LS and to the turning off of the detection transistor QsL, until when Sens-L switches to a low logic value as a result of the current flowing through the detection transistor QsL being lower than the reference current IcrossL. The low logic value of Sens-L leads to a change of the hysteresis Vgs threshold, insofar as a total current IsoftL=IsL+IcrossL is sourced to node 203L. As a result of Sens-L switching to a low logic value, the low-side power transistor LS is considered as definitely switched off (Vgs<Vgs.crossL), so the high-side power transistor HS can be switched on at IN-H='0'. Since at this time Sens-H='1', the detection transistor QsH has to provide a high current (i.e., to pass a higher threshold) equal to IsoftH=IsH+IcrossH to bring the high-side current regulation signal Sens-H to a low logic value. This same transition changes the hysteresis threshold on the high side to a lower threshold, corresponding to the (only) current IcrossH. At the same time, as a result of Sens-H assuming a low logic value, the gate terminal of the high-side power transistor HS is discharged at a higher rate, insofar as the transistor Q2H is enabled to sink a current i2H therefrom.

During opposite transitions of the driving digital signal INPUT ('0'→'1'), complementary operation takes place.

In one or more embodiments, the two values of the Vgs threshold (referred to as Vgs.cross and Vgs.soft) may be chosen consistently with system specifications, such as the types of components used, the maximum load current, the maximum PWM output voltage, and the same temperature. This is facilitated if the power transistor (HS, LS) and the corresponding sensing circuitry (detection transistor QsH, QsL) are as closely matched as possible, positioned close together and on the same temperature gradient.

In one or more embodiments, the lower threshold Vgs.cross may be set to values close to the threshold voltage of the power transistors HS, LS (e.g., about 1V or less), so that the opposite power transistor is turned on only when the current power transistor is certainly off, countering cross conduction problems.

In one or more embodiments, the upper threshold Vgs.soft may be set close to the gate-source voltage value in a plateau zone where the "soft turn-on" ends, after the complete discharge of the recirculation diode in the opposite power transistor. If the threshold Vgs.soft is set too high, the system efficiency may decrease, insofar as the turn-on phase of the power transistors may take longer time.

One or more embodiments may thus apply to those systems which include class-D half-bridge amplifiers involving demanding (e.g., aggressive) driving and increased overall efficiency.

One or more embodiments may thus provide one or more of the following advantages:
  easy implementation of a circuit for regulating the speed of the turn-on current of the power transistors and, optionally, for countering cross conduction;
  possibility of adjusting the speed of the turn-on current of the power transistors without following the trend of the output signal OUTPUT, which may be affected by the external load.

As exemplified herein, a circuit (e.g., 10') may comprise:
  a high-side switch (e.g., HS) coupled between a supply voltage rail (e.g., 102) and an output node (e.g., 104);
  a low-side switch (e.g., LS) coupled between the output node and a reference voltage rail (e.g., 106);
  a first inverter arrangement configured to receive a high-side control signal (e.g., $\overline{\text{IN-H}}$) and to produce a high-side gate control signal (e.g., IN-H$_{gate}$) for the high-side switch; and
  a second inverter arrangement configured to receive a low-side control signal (e.g., $\overline{\text{IN-L}}$) and to produce a low-side gate control signal (e.g., IN-L$_{gate}$) for the low-side switch.

As exemplified herein, the first inverter arrangement may comprise:
  a charge current path (e.g., Q0H) between the supply voltage rail and a control terminal of the high-side switch, the charge current path being activatable to source a charge current to the control terminal of the high-side switch,
  a first discharge current path (e.g., Q1H) between the control terminal of the high-side switch and a respective reference voltage rail (e.g., 110H), the first discharge current path being activatable to sink a first discharge current (e.g., i1H) from the control terminal of the high-side switch, and
  a second discharge current path (e.g., Q2H, Q3H) between the control terminal of the high-side switch and the respective reference voltage rail, the second discharge current path being activatable to sink a second discharge current (e.g., i2H) from the control terminal of the high-side switch.

As exemplified herein, the second inverter arrangement may comprise:
  a discharge current path (e.g., Q0L) between the reference voltage rail and a control terminal of the low-side switch, the discharge current path being activatable to sink a discharge current from the control terminal of the low-side switch,
  a first charge current path (e.g., Q1L) between the control terminal of the low-side switch and a respective supply voltage rail (e.g., 110L), the first charge current path being activatable to source a first charge current (e.g., i1L) to the control terminal of the low-side switch, and
  a second charge current path (e.g., Q2L, Q3L) between the control terminal of the low-side switch and the respective supply voltage rail, the second charge current path being activatable to source a second charge current (e.g., i2L) to the control terminal of the low-side switch.

As exemplified herein, the circuit may comprise a high-side sensing current path (e.g., QsH, 202H) arranged between the supply voltage rail and the respective reference voltage rail, the high-side sensing current path (QsH, 202H) comprising:
  a high-side sensing transistor (e.g., QsH) having a current path coupled between the supply voltage rail and an intermediate high-side control node (e.g., 203H), and a gate terminal coupled to the control terminal of the high-side switch, and
  a first high-side current source (e.g., 202H) coupled between the intermediate high-side control node and the respective reference voltage rail to sink a first high-side reference current (e.g., IcrossH) from the intermediate high-side control node.

As exemplified herein, the circuit may comprise a low-side sensing current path (e.g., QsL, 202L) arranged between the reference voltage rail and the respective supply voltage rail, the low-side sensing current path (QsL, 202L) comprising:
  a low-side sensing transistor (e.g., QsL) having a current path coupled between the reference voltage rail and an intermediate low-side control node (e.g., 203L), and a gate terminal coupled to the control terminal of the low-side switch, and
  a first low-side current source (e.g., 202L) coupled between the intermediate low-side control node and the respective supply voltage rail to source a first low-side reference current (e.g., IcrossL) to the intermediate low-side control node.

As exemplified herein, the second discharge current path may be selectively enabled in response to a high-side detection signal (e.g., $\overline{\text{Sens-H}}$) at the intermediate high-side control node having a high logic value, and the second charge current path may be selectively enabled in response to a low-side detection signal (e.g., $\overline{\text{Sens-L}}$) at the intermediate low-side control node having a low logic value.

As exemplified herein, the second discharge current path may comprise a high-side control transistor (e.g., Q3H) having a control terminal coupled (e.g., directly connected) to the intermediate high-side control node and configured to selectively enable the second discharge current path, and the second charge current path may comprise a low-side control transistor (e.g., Q3L) having a control terminal coupled (e.g., directly connected) to the intermediate low-side control node and configured to selectively enable the second charge current path.

As exemplified herein, the high-side sensing current path may comprise a second high-side current source (e.g., 204H) coupled between the intermediate high-side control node and the respective reference voltage rail to sink a second high-side reference current (e.g., IsH) from the intermediate high-side control node, and the second high-side current source may be enabled in response to the high-side detection signal at the intermediate high-side control node having a low logic value.

As exemplified herein, the low-side sensing current path may comprise a second low-side current source (e.g., 204L)

coupled between the intermediate low-side control node and the respective supply voltage rail to source a second low-side reference current (e.g., IsL) to the intermediate low-side control node, and the second low-side current source may be enabled in response to the low-side detection signal at the intermediate low-side control node having a high logic value.

As exemplified herein, the first discharge current may be lower than the second discharge current, and/or the first charge current may be lower than the second charge current.

As exemplified herein, the high-side switch may comprise a high-side power transistor, optionally a p-channel MOS transistor, and the low-side switch may comprise a low-side power transistor, optionally an n-channel MOS transistor.

As exemplified herein, the high-side sensing transistor may be of the same type as the high-side power transistor and may have smaller dimensions (e.g., from 1/100th to 1/1000th of the dimensions of the high-side power transistor), and the low-side sensing transistor may be of the same type as the low-side power transistor and may have smaller dimensions (e.g., from 1/100th to 1/1000th of the dimensions of the low-side power transistor.

As exemplified herein, the circuit may comprise:
an input node (e.g., 304) configured to receive a pulse-width modulated driving signal (e.g., INPUT),
an OR logic gate (e.g., 302H) configured to combine the pulse-width modulated driving signal and an inverted replica (e.g., Sens-L) of the low-side detection signal,
an inverter circuit (e.g., 108H) coupled to the output of the OR logic gate to produce the high-side control signal,
an AND logic gate (e.g., 302L) configured to combine the pulse-width modulated driving signal and an inverted replica (e.g., Sens-H) of the high-side detection signal, and
an inverter circuit (e.g., 108L) coupled to the output of the AND logic gate to produce the low-side control signal.

As exemplified herein, a method of operating a circuit according to one or more embodiments may comprise:
receiving a high-side control signal and producing a high-side gate control signal for the high-side switch, wherein the producing a high-side gate control signal (IN-H$_{gate}$) may comprise:
sourcing a charge current to the control terminal of the high-side switch in response to the high-side control signal having a low logic value, and
sinking a first discharge current from the control terminal of the high-side switch in response to the high-side control signal having a high logic value;
receiving a low-side control signal and producing a low-side gate control signal for the low-side switch, wherein the producing a low-side gate control signal may comprise:
sinking a discharge current from the control terminal of the low-side switch in response to the low-side control signal having a high logic value, and
sourcing a first charge current to the control terminal of the low-side switch in response to the low-side control signal having a low logic value;
producing a high-side detection signal at the intermediate high-side control node, wherein the producing a high-side detection signal may comprise sourcing a current to the intermediate high-side control node in response to the high-side switch being in a conductive state, and sinking a first high-side reference current from the intermediate high-side control node;
producing a low-side detection signal at the intermediate low-side control node, wherein the producing a low-side detection signal may comprise sinking a current from the intermediate low-side control node in response to the low-side switch being in a conductive state, and sourcing a first low-side reference current to the intermediate low-side control node;
sinking a second discharge current from the control terminal of the high-side switch in response to the high-side control signal having a high logic value and the high-side detection signal having a high logic value; and
sourcing a second charge current to the control terminal of the low-side switch in response to the low-side control signal having a low logic value and the low-side detection signal having a low logic value.

Without prejudice to the underlying principles, the details and embodiments may vary, even significantly, with respect to what has been described by way of example only, without departing from the extent of protection.

The extent of protection is determined by the annexed claims.

What is claimed is:
1. A circuit, comprising:
a high-side switch coupled between a first supply voltage rail and an output node;
a low-side switch coupled between the output node and a first reference voltage rail;
a first inverter arrangement configured to receive a high-side control signal and to produce a high-side gate control signal for the high-side switch, the first inverter arrangement comprising:
a first discharge current path between a control terminal of the high-side switch and a second reference voltage rail, the first discharge current path being activatable to sink a first discharge current from the control terminal of the high-side switch; and
a second discharge current path between the control terminal of the high-side switch and the second reference voltage rail, the second discharge current path being activatable to sink a second discharge current from the control terminal of the high-side switch;
a second inverter arrangement configured to receive a low-side control signal and to produce a low-side gate control signal for the low-side switch, the second inverter arrangement comprising:
a first charge current path between a control terminal of the low-side switch and a second supply voltage rail, the first charge current path being activatable to source a first charge current to the control terminal of the low-side switch; and
a second charge current path between the control terminal of the low-side switch and the second supply voltage rail, the second charge current path being activatable to source a second charge current to the control terminal of the low-side switch;
a high-side sensing current path arranged between the first supply voltage rail and the second reference voltage rail, the high-side sensing current path comprising:
a high-side sensing transistor having a first current path coupled between the first supply voltage rail and an intermediate high-side control node, and a gate terminal coupled to the control terminal of the high-side switch; and
a first high-side current source coupled between the intermediate high-side control node and the second reference voltage rail to sink a first high-side reference current from the intermediate high-side control node; and
a low-side sensing current path arranged between the first reference voltage rail and the second supply voltage rail, the low-side sensing current path comprising:
a low-side sensing transistor having a second current path coupled between the first reference voltage rail and an intermediate low-side control node, and a gate terminal coupled to the control terminal of the low-side switch; and
a first low-side current source coupled between the intermediate low-side control node and the second supply voltage rail to source a first low-side reference current to the intermediate low-side control node;
wherein the second discharge current path is selectively enablable in response to a high-side detection signal at the intermediate high-side control node having a high logic value, and the second charge current path is selectively enablable in response to a low-side detection signal at the intermediate low-side control node having a low logic value.

2. The circuit of claim 1, wherein:
the second discharge current path comprises a high-side control transistor having a first control terminal coupled to the intermediate high-side control node and configured to selectively enable the second discharge current path; and
the second charge current path comprises a low-side control transistor having a second control terminal coupled to the intermediate low-side control node and configured to selectively enable the second charge current path.

3. The circuit of claim 1, wherein:
the high-side sensing current path comprises a second high-side current source coupled between the intermediate high-side control node and the second reference voltage rail to sink a second high-side reference current from the intermediate high-side control node, the second high-side current source being enabled in response to the high-side detection signal at the intermediate high-side control node having the low logic value; and
the low-side sensing current path comprises a second low-side current source coupled between the intermediate low-side control node and the second supply voltage rail to source a second low-side reference current to the intermediate low-side control node, the second low-side current source being enabled in response to the low-side detection signal at the intermediate low-side control node having the high logic value.

4. The circuit of claim 1, wherein the first discharge current is lower than the second discharge current, and/or the first charge current is lower than the second charge current.

5. The circuit of claim 1, wherein the high-side switch comprises a high-side power transistor, and the low-side switch comprises a low-side power transistor.

6. The circuit of claim 5, wherein the high-side power transistor is a p-channel metal-oxide-semiconductor (MOS) transistor, and the low-side power transistor is an n-channel MOS transistor.

7. The circuit of claim 5, wherein the high-side sensing transistor is of the same type as and has smaller dimensions than the high-side power transistor, and the low-side sensing transistor is of the same type as and has smaller dimensions than the low-side power transistor.

8. The circuit of claim 1, comprising:
an input node configured to receive a pulse-width modulated driving signal;
an OR logic gate configured to combine the pulse-width modulated driving signal and an inverted replica of the low-side detection signal;
a first inverter circuit coupled to an output of the OR logic gate to produce the high-side control signal;
an AND logic gate configured to combine the pulse-width modulated driving signal and an inverted replica of the high-side detection signal; and
a second inverter circuit coupled to an output of the AND logic gate to produce the low-side control signal.

9. A method of operating a circuit comprising a high-side switch coupled between a first supply voltage rail and an output node, a low-side switch coupled between the output node and a first reference voltage rail, a high-side sensing transistor having a first current path coupled between the first supply voltage rail and an intermediate high-side control node, and a low-side sensing transistor having a second current path coupled between the first reference voltage rail and an intermediate low-side control node, the method comprising:
receiving a high-side control signal and producing a high-side gate control signal for the high-side switch, the producing the high-side gate control signal comprising:
sourcing a charge current to a control terminal of the high-side switch in response to the high-side control signal having a low logic value; and
sinking a first discharge current from the control terminal of the high-side switch in response to the high-side control signal having a high logic value;
receiving a low-side control signal and producing a low-side gate control signal for the low-side switch, the producing the low-side gate control signal comprising:
sinking a discharge current from a control terminal of the low-side switch in response to the low-side control signal having the high logic value; and
sourcing a first charge current to the control terminal of the low-side switch in response to the low-side control signal having the low logic value;
producing a high-side detection signal at the intermediate high-side control node, the producing the high-side detection signal comprising sourcing a current to the intermediate high-side control node in response to the high-side switch being in a conductive state, and sinking a first high-side reference current from the intermediate high-side control node;
producing a low-side detection signal at the intermediate low-side control node, the producing the low-side detection signal comprises sinking a current from the intermediate low-side control node in response to the low-side switch being in the conductive state, and sourcing a first low-side reference current to the intermediate low-side control node;
sinking a second discharge current from the control terminal of the high-side switch in response to the high-side control signal having the high logic value and the high-side detection signal having the high logic value; and
sourcing a second charge current to the control terminal of the low-side switch in response to the low-side control signal having the low logic value and the low-side detection signal having the low logic value.

10. The method of claim 9, wherein the circuit further comprises a first discharge current path between a control terminal of the high-side switch and a second reference voltage rail, a second discharge current path between the control terminal of the high-side switch and the second reference voltage rail, a first charge current path between a control terminal of the low-side switch and a second supply voltage rail, and a second charge current path between the control terminal of the low-side switch and the second supply voltage rail, and the method further comprises:

selectively enabling, by a high-side control transistor having a first control terminal coupled to the intermediate high-side control node, the second discharge current path; and selectively enabling, by a low-side control transistor having a second control terminal coupled to the intermediate low-side control node, the second charge current path.

11. The method of claim 9, further comprising:
enabling a second high-side current source in response to the high-side detection signal at the intermediate high-side control node having the low logic value; and
enabling a second low-side current source in response to the low-side detection signal at the intermediate low-side control node having the high logic value.

12. The method of claim 11, further comprising:
sinking, by the second high-side current source coupled between the intermediate high-side control node and a second reference voltage rail in the high-side sensing current path, a second high-side reference current from the intermediate high-side control node; and
sourcing, by the second low-side current source coupled between the intermediate low-side control node and a second supply voltage rail in the low-side sensing current path, a second low-side reference current to the intermediate low-side control node.

13. The method of claim 9, wherein the first discharge current is lower than the second discharge current, and/or the first charge current is lower than the second charge current.

14. The method of claim 9, comprising:
receiving, by an input node, a pulse-width modulated driving signal;
combining, by an OR logic gate, the pulse-width modulated driving signal and an inverted replica of the low-side detection signal;
producing, by a first inverter circuit coupled to an output of the OR logic gate, the high-side control signal;
combining, by an AND logic gate, the pulse-width modulated driving signal and an inverted replica of the high-side detection signal; and
producing, by a second inverter circuit coupled to an output of the AND logic gate, the low-side control signal.

15. A circuit, comprising:
a high-side switch coupled between a first supply voltage rail and an output node;
a low-side switch coupled between the output node and a first reference voltage rail;
a first discharge current path between a control terminal of the high-side switch and a second reference voltage rail, the first discharge current path being activatable to sink a first discharge current from the control terminal of the high-side switch;
a second discharge current path between the control terminal of the high-side switch and the second reference voltage rail, the second discharge current path being activatable to sink a second discharge current from the control terminal of the high-side switch;
a first charge current path between a control terminal of the low-side switch and a second supply voltage rail, the first charge current path being activatable to source a first charge current to the control terminal of the low-side switch;
a second charge current path between the control terminal of the low-side switch and the second supply voltage rail, the second charge current path being activatable to source a second charge current to the control terminal of the low-side switch;
a high-side sensing transistor having a first current path coupled between the first supply voltage rail and an intermediate high-side control node, and a gate terminal coupled to the control terminal of the high-side switch;
a first high-side current source coupled between the intermediate high-side control node and the second reference voltage rail to sink a first high-side reference current from the intermediate high-side control node;
a low-side sensing transistor having a second current path coupled between the first reference voltage rail and an intermediate low-side control node, and a gate terminal coupled to the control terminal of the low-side switch; and
a first low-side current source coupled between the intermediate low-side control node and the second supply voltage rail to source a first low-side reference current to the intermediate low-side control node;
wherein the second discharge current path is selectively enablable in response to a high-side detection signal at the intermediate high-side control node having a high logic value, and the second charge current path is selectively enablable in response to a low-side detection signal at the intermediate low-side control node having a low logic value.

16. The circuit of claim 15, wherein:
the second discharge current path comprises a high-side control transistor having a first control terminal coupled to the intermediate high-side control node and configured to selectively enable the second discharge current path; and
the second charge current path comprises a low-side control transistor having a second control terminal coupled to the intermediate low-side control node and configured to selectively enable the second charge current path.

17. The circuit of claim 15, wherein:
a high-side sensing current path comprises a second high-side current source coupled between the intermediate high-side control node and the second reference voltage rail to sink a second high-side reference current from the intermediate high-side control node, the second high-side current source being enabled in response to the high-side detection signal at the intermediate high-side control node having the low logic value; and
a low-side sensing current path comprises a second low-side current source coupled between the intermediate low-side control node and the second supply voltage rail to source a second low-side reference current to the intermediate low-side control node, the second low-side current source being enabled in response to the low-side detection signal at the intermediate low-side control node having the high logic value.

18. The circuit of claim 15, wherein the first discharge current is lower than the second discharge current, and/or the first charge current is lower than the second charge current.

19. The circuit of claim 15, wherein the high-side switch comprises a high-side power transistor, and the low-side switch comprises a low-side power transistor.

20. The circuit of claim 15, comprising:
- an input node configured to receive a pulse-width modulated driving signal;
- an OR logic gate configured to combine the pulse-width modulated driving signal and an inverted replica of the low-side detection signal;
- a first inverter circuit coupled to an output of the OR logic gate to produce a high-side control signal;
- an AND logic gate configured to combine the pulse-width modulated driving signal and an inverted replica of the high-side detection signal; and
- a second inverter circuit coupled to an output of the AND logic gate to produce a low-side control signal.

* * * * *